United States Patent [19]
Vicich

[11] Patent Number: 6,159,045
[45] Date of Patent: Dec. 12, 2000

[54] METHOD AND APPARATUS FOR ENGAGING AN ELECTRICAL COMPONENT TO A CIRCUIT BOARD

[75] Inventor: Brian R. Vicich, Louisville, Ky.

[73] Assignee: Samtec, Inc., New Albany, Ind.

[21] Appl. No.: 09/173,377

[22] Filed: Oct. 15, 1998

[51] Int. Cl.[7] .............................. H01R 13/73; H02B 1/01
[52] U.S. Cl. ...................... 439/571; 439/876; 174/260
[58] Field of Search ..................... 439/567, 571, 439/572, 566, 876, 79, 99; 200/294, 296; 174/260, 262, 263, 264

[56] References Cited

U.S. PATENT DOCUMENTS

| | | | |
|---|---|---|---|
| 5,316,500 | 5/1994 | Vanaleck et al. | 439/571 |
| 5,405,267 | 4/1995 | Koegel et al. | 439/571 |

*Primary Examiner*—Paula Bradley
*Assistant Examiner*—Antoine Ngandjui
*Attorney, Agent, or Firm*—Woodard, Emhardt, Naughton, Moriarty & McNett

[57] ABSTRACT

A method and apparatus for engaging electrical components to a circuit board. The body of the component has at least one fastener integrally formed therewith. The at least one fastener includes a neck portion engaged to the body of the component and extending to a hook portion. The fastener is configured to reside substantially within a through-hole formed in a circuit board. The through-hole in the circuit board has a solder lining, and the fastener is placed into the through-hole. The solder is reflowed via known soldering techniques so that the hook portion of the fastener is engaged by the reflowed solder, thus engaging the component to the circuit board.

23 Claims, 3 Drawing Sheets

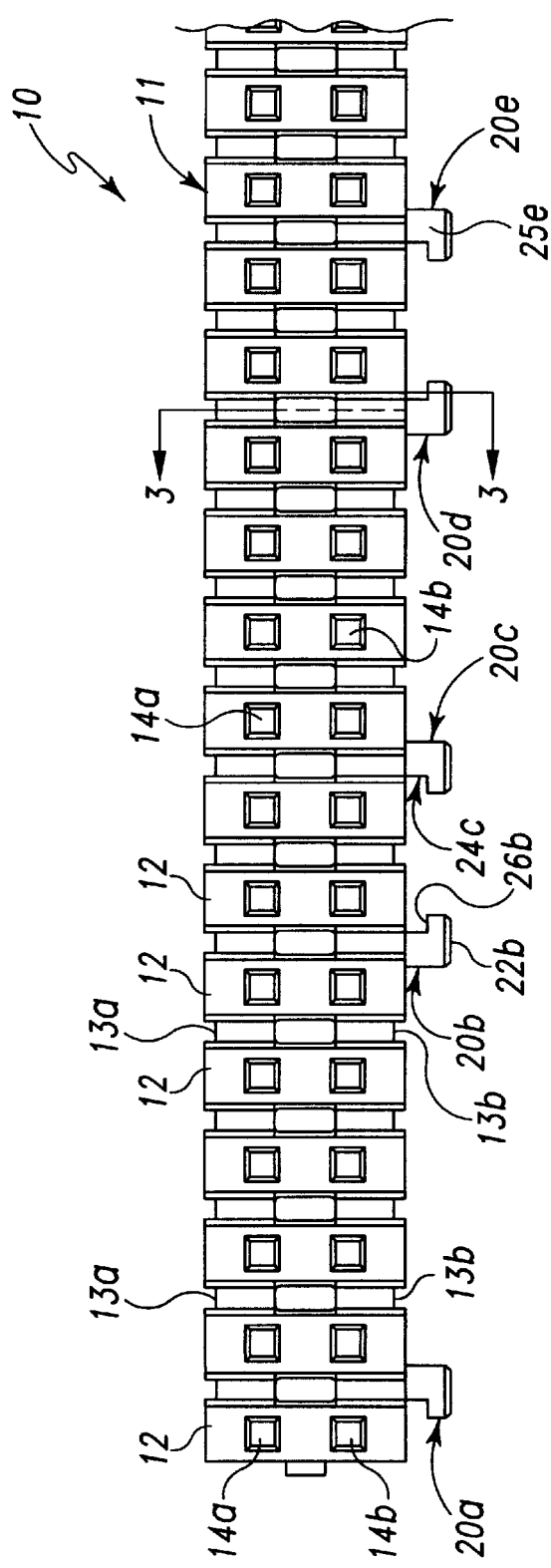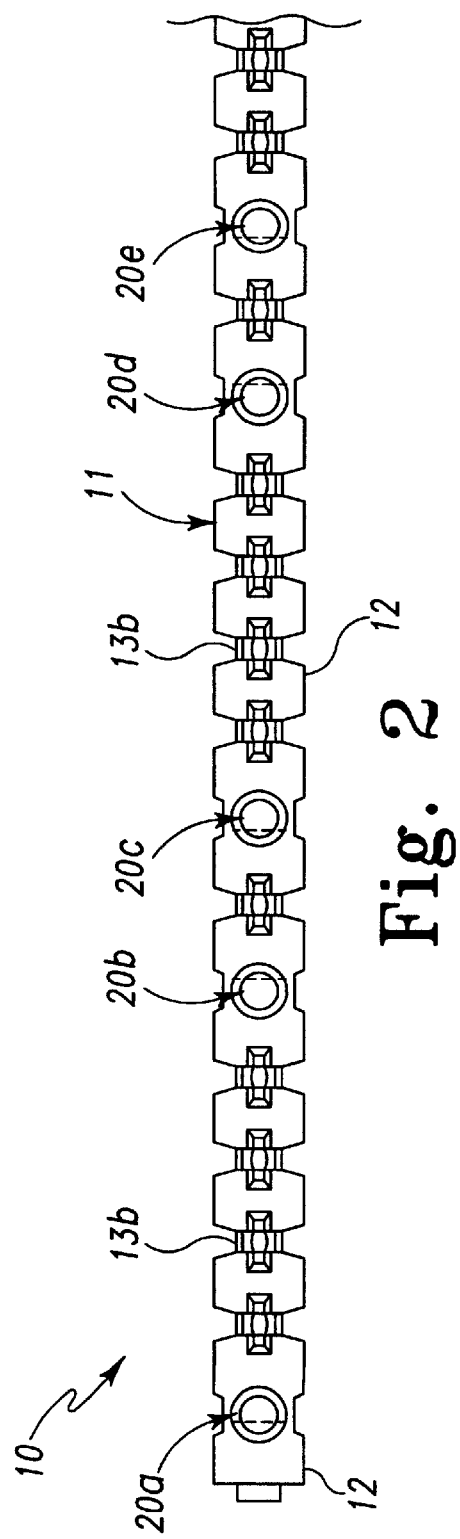

METHOD AND APPARATUS FOR ENGAGING AN ELECTRICAL COMPONENT TO A CIRCUIT BOARD

TECHNICAL FIELD OF THE INVENTION

The present invention relates generally to electrical components and, more particularly, to a method and apparatus for engaging an electrical component to a circuit board.

BACKGROUND OF THE INVENTION

Electrical components are commonly used with circuit boards in the electronics industry to build various electrical devices and products. In order to build such devices and products, it is necessary to provide for the connection of various components to the circuit board and with other components. The components engaged to the circuit board enable many different types of interfaces between the board and the components, depending on the type of component that is to be engaged and the orientation of the component with respect to the circuit board.

The component to be engaged to the board may be of any type of component known to those in the industry. For example by way of illustration and not limitation, the component to be engaged to the circuit board may be an electrical card interface component engaged to a plurality of pins electrically connected to the board. Typically, the card interface component includes a pair of guide rails to maintain alignment of the card as it is inserted to connect with the pins to hold the card in place after insertion. A second type of electrical component is a cable interface component that allows a cable to be electrically engaged to the board. Another type of component typically engaged to a circuit board is an electrical connector. Connectors allow a first circuit board to be electrically connected to a second circuit board. Connectors also allow other electrical components to be electrically engaged to a circuit board in which the connector is engaged via the connector.

In general, connectors for circuit boards may be divided into two categories, through-hole and surface mount connectors. Both types of connectors typically include a conductive lead that is soldered to a conductive trace on the surface of the circuit board. For example, surface mount connectors may be engaged to a conductive trace on the surface of the circuit board by a tail portion of the contact that protrudes from the bottom of the connector body. The tail portion rests on a conductive pad on the surface of the board. The tail of the contact is soldered to the conductive pad using soldering techniques known in the industry.

One problem commonly associated with connectors and their connection to circuit boards is that the leads soldered to the board may break off and cause the connector to disengage from the circuit board. Another problem is that the solder joint of the surface mount connector must resist external forces applied to the connector, thus inducing additional stress into the electrical connection. This problem similarly exists with other electrical components that are engaged to the circuit board via solder connections to conductive traces on the board.

One technique known in the industry in an attempt to address the above-described problem has been to engage metal tabs to the connector body. The tabs are configured to extend through corresponding holes formed through the circuit board. In one form, the tabs include two halves that are spring loaded to come together during insertion, and to spring back to their original position once inserted. The insertion end of the tab includes a shoulder or collar that engages the bottom surface of the circuit board. This technique for engaging a component to a circuit board also suffers disadvantages. For example, the tab projects from the bottom surface of the board, and is thus subject to being broken if accidentally engaged. Also, the protrusion of the tab increases the height requirements between adjacent circuit boards. Additionally, the tabs are installed on the component after the body of the component is manufactured, thus requiring an additional step in the manufacturing process.

Another problem known in the industry is illustrated by referring to card interface components. Card interface components typically include guide rails that are mounted to the connector board. A first end of the guide rail interfaces with the pins that electrically engage the card. The pins extend through holes in the board and are soldered thereto, thus securely mounting the first end of the guide rail to the board. The second end of the guide rail, configured to receive the card as it is inserted, is not securely attached to the board. Thus, unless a tab is installed on the second end as described above, the second end of the guide rail is allowed to rotate about its first end when a force is applied to the second end by, for example, insertion of the card into the guide rails. This rotation may cause additional stress in the pins and their solder connection to the trace on the board.

It should be understood that the specific problems described above with respect to surface mount connectors and guide rails have been provided for illustration purposes only, and are not intended to be limiting. All electrical components that are mountable to a circuit board present problems similar to those described above in addition to other problems. Heretofore, the techniques and devices for engaging electrical components to circuit boards have not adequately addressed many of these problems. There is therefore a need in the art for an improved method and apparatus for engaging electrical components to a circuit board. The present invention is directed toward meeting these and other needs in a novel and unobvious way.

SUMMARY OF THE INVENTION

A method and apparatus for engaging electrical components to a circuit board. The body of the component has at least one fastener integrally formed therewith. The at least one fastener includes a neck portion engaged to the body of the component and extending to a hook portion. The fastener is configured to reside substantially within a through-hole formed in a circuit board. The through-hole in the circuit board has a solder lining, and the fastener is placed into the through-hole. The solder is reflowed via known soldering techniques so that the hook portion of the fastener is engaged by the reflowed solder, thus engaging the component to the circuit board.

One object of the present invention is to provide an improved method and apparatus for engaging an electrical component to a circuit board. Related objects and advantages of the present invention will be apparent from the following description of the preferred embodiments.

BRIEF DESCRIPTION OF THE DRAWINGS

FIG. 1 is elevation view of an electrical component having one embodiment of a fastener of the present invention engaged thereto.

FIG. 2 is a bottom view of the component and fastener of FIG. 1.

DESCRIPTION OF THE PREFERRED EMBODIMENTS

Figure 3:
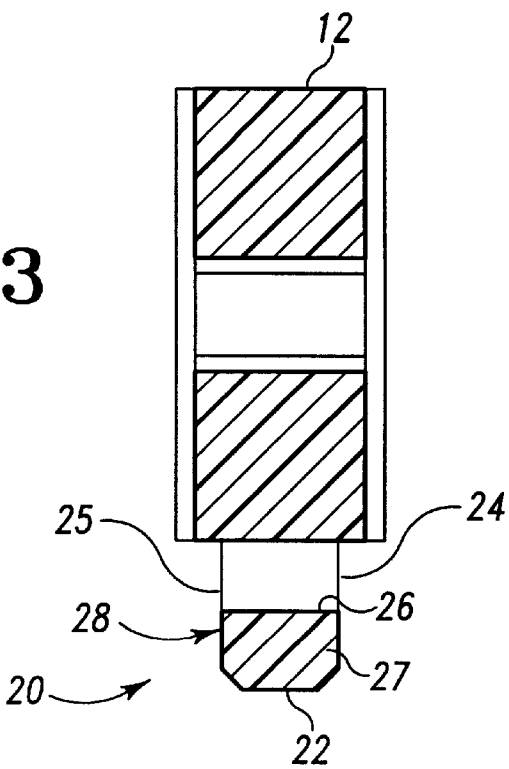
FIG. 3 is a section view taken along line 3—3 of FIG. 1.

For the purposes of promoting an understanding of the principles of the invention, reference will now be made to the embodiments illustrated in the drawings and specific language will be used to describe the same. It will nevertheless be understood that no limitation of the scope of the invention is thereby intended, any alterations and further modifications in the illustrated devices, and any further applications of the principles of the invention as illustrated therein are contemplated as would normally occur to one skilled in the art to which the invention relates.

Referring now to FIG. 1, an electrical component 10 is illustrated having a plurality of fasteners 20 engaged thereto. In the illustrated embodiment, electrical component 10 is an electrical connector that is typically mounted to a circuit board (not shown). The electrical component 10 includes a body 11 having a plurality of substantially identical connector segments 12 throughout its length. Each connector segment 12 is linked to an adjacent connector segment 12 by linking segments 13a, 13b. Each connector segment 12 additionally defines a pair of connecting portions 14a, 14b. In FIG. 1, connecting portions 14a, 14b are illustrated as a plurality of holes that contain a contact (not illustrated) to electrically engage a plurality of pins from a second electrical component. In another embodiment, connecting portions 14a, 14b are pins extending through the connector segments 12. It is believed that the design and configuration of connector segments 12, linking segments 13a, 13b and connecting portions 14a, 14b are known to those skilled in the art. Fasteners 20a, 20b, 20c, 20d, 20e, . . . (collectively designated as fasteners 20) are engaged at spaced intervals to the body 11.

It should be understood that the type of electrical component 10 provided is not critical to the present invention, only that the component 10 have a body 11 with at least one fastener 20 engaged thereto. The electrical component 10 of FIG. 1 is illustrated as a connector, and is presented only as an example of one type of electrical component that may be used with the present invention. For example, the component 10 may include only a single connecting portion 14 for each connector segment 12. In one embodiment, the connector device is a surface mount connector. In another embodiment the electrical device is a through-hole connector. Other embodiments contemplate other electrical components as would occur to those of skill in the art to which the present invention relates.

A plurality of fasteners 20 extends from body 11 of electrical device 10. The details of fastener 20 will be now be described with reference to FIGS. 1–3. Each fastener 20 extends from body 11 toward a mounting surface (not shown), which is preferably a circuit board defining a number of through-holes corresponding to the number of fasteners 20. Fastener 20 includes a neck portion 25 engaged to the body 11. Neck portion 25 extends to a tail portion 27. Tail portion 27 includes an insertion end 22 distal from connector body 11. In a preferred embodiment, tail portion 27 also defines a catch 26 extending substantially perpendicular from neck portion 25. In one embodiment, the neck portion 25 and tail portion 27 define an L-shape, as illustrated in FIG. 1. In a preferred embodiment, neck portion 25 has a surface 24 inset from the wall (shown as 41 in FIGS. 4–5) of the at least one through-hole (shown as 42 in FIGS. 4–5). However, other shapes are also contemplated herein, such as a J-shape, an inverted T-shape, or a fastener 20 having a single slot or plurality of holes formed through the tail portion 27.

Tail portion 27 additionally defines an outer surface 28 thereabout. In a preferred embodiment, the outer surface 28 of neck portion 25 defines a cylindrical profile. Other embodiments contemplate different profiles for outer surface 28, including a square profile, a rectangular profile, or an oval shaped profile.

Figure 4:
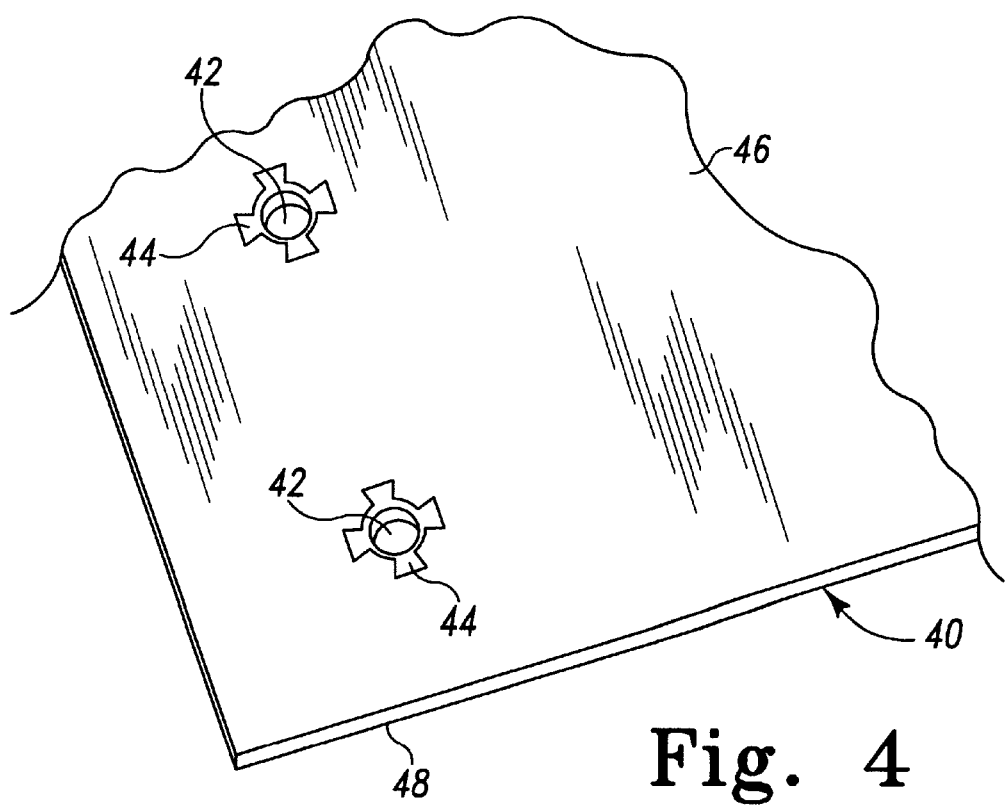
FIG. 4 is a partially fragmented perspective view of a section of a circuit board for use with the fastener of the present invention.
Figure 5:
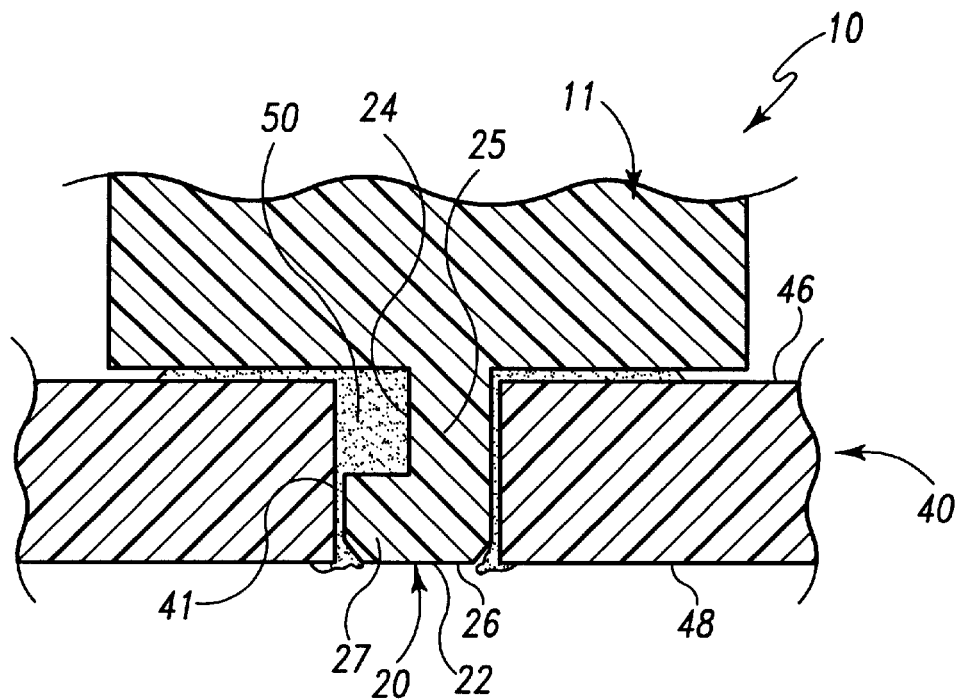
FIG. 5 is a section view of the fastener of the present invention engaged to the circuit board of FIG. 4.

Referring now to FIGS. 4–5, a method for engaging electrical component 10 to a circuit board 40 will now be described. Circuit board 40 includes at least one through-hole 42. Through-hole 42 extends from a top surface 46 to a bottom surface 48 of board 40. Through-hole 42 has a wall 41 that defines the hole 42 and extends from the top surface 46 to the bottom surface 48. Preferably, the wall 41 has a cylindrical profile, although other types of profiles are not precluded by the present invention. Through-hole 42 is lined with solder 44. In a preferred embodiment, solder 44 is a solder paste that is placed around and in the through-hole 42. It is preferred that the solder 44 likewise be provided from top surface 46 to bottom surface 48.

In order to engage the device 10 to the board 40, a connector body 11 is placed on the appropriate side of the circuit board with fastener 20 extending through a corresponding one of the through-holes 42. In a preferred embodiment, insertion end 22 of fastener 20 is substantially co-planar with bottom surface 48. The hole 42 has a wall 41 there around. The fastener 20 is sized such that outer surface 28 fits substantially within the walls 41 of hole 42 between top surface 46 and bottom surface 48.

Referring specifically to FIG. 5, the fastener 20 is shown engaged within through-hole 42 by the reflowed solder 50. In order to engage the electrical device 10, the fastener 20 is placed in a through-hole 42 with solder paste 44 formed therearound. The electrical device 10 and circuit board 40 are then placed in an oven in order to reflow the solder 44. Solder 44 reflows to form reflow solder 50. As shown in FIG. 5, reflow solder 50 substantially fills the void between fastener 20 and the wall 41 of through-hole 42. The catch 26 of tail portion 27 provides substantial resistance to dislodgment of the electrical component device 10 from the reflow solder 50. Additional resistance is provided by the frictional engagement between the reflow solder 50, the wall 41, and the fastener 20.

In a most preferred embodiment, the fastener 20 is integrally formed with body 11 of electrical component 10. Body portion 11 and fastener 20 are formed from a high-temperature plastic. In one embodiment, the fastener 20 and connector body 11 are integrally formed by an unitary injection molding process. This construction for fastener 20 and body 11 has the advantage that the fastener 20 is manufactured simultaneously with the body 11, thus eliminating additional components and additional steps in the manufacturing process. The high-temperature plastic has a melting point that is higher than the temperature required to reflow the solder 42 so that fastener 20 maintains its structural integrity throughout the soldering process. When the reflow solder 50 hardens, it then engages the component 10 to circuit board 40 via fastener 20.

Figure 6:
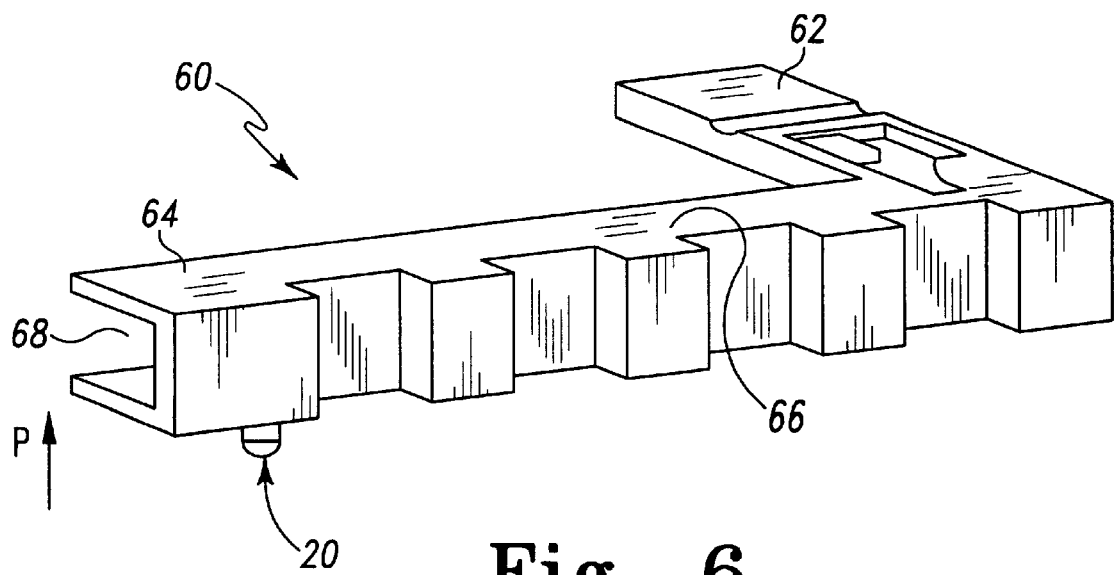
FIG. 6 is a perspective view of another electrical component having the fastener of the present invention engaged thereto.

As described above, it is contemplated herein that the fastener 20 may be provided on all types of components that may be attached to a circuit board. For example, in FIG. 6 there is illustrated one-half of a pair of guide rails for insertion of a card interface. Card guide 60 includes a connection end 62 and an insertion end 64 with a guide rail 66 extending therebetween. A card is inserted into insertion end 64 via slot 68 and slid along rail 66 to engage a plurality of pins (not shown) at connection end 62. An oppositely opposed guide rail (not shown) is also used to guide the card as it is inserted into slot 68. The fastener 20 is provided adjacent card insertion end 64. Insertion end 64 is engaged to the circuit board by fastener 20 to prevent the card guide 60 from being rotated in the direction indicated by arrow P as the card is inserted between the guide rails 66.

It should be appreciated that the configuration of tail portion 27 and neck portion 25 is not critical to the present invention, so long as tail portion 27 is configured to engage the reflow solder 50. For example, in one embodiment the catch 26 extends from neck portion 25 in all directions to form an inverted T shape. In another embodiment, catch 26 is sloped with respect to the top and bottom surfaces of the board. Other embodiments contemplate other configurations for tail portion 27 of fastener 20, so long as the principals of the present invention are met.

While the invention has been illustrated and described in detail in the drawings and foregoing description, the same is to be considered as illustrative and not restrictive in character, it being understood that only the preferred embodiments have been shown and described and that all changes and modifications that come within the spirit of the invention are desired to be protected.

What is claimed is:

1. An apparatus for engaging an electrical component to a circuit board defining a top surface and an opposite surface and at least one third surface defining at least one through-hole, comprising:

at least one fastener integrally formed with a body of the electrical component, the at least one fastener including:
        a tail portion distal from the body of the electrical component; and
        a neck portion extending from said body to said tail portion; and
        solder; and
    wherein said at least one fastener is formed so that when said electrical component is engaged to said circuit board adjacent said top surface and a force is applied to said electrical component in the direction normal to said top surface and away from said circuit board, said force is substantially opposed by shearing forces between said at least one third surface and said solder, said shearing forces being transferred to said at least one fastener via said solder.

2. The apparatus of claim 1, wherein said body and said fastener are made from high-temperature plastic.

3. The apparatus of claim 1, wherein said tail portion and said neck portion define a J-shape.

4. The apparatus of claim 1, wherein said tail portion comprises a catch, said catch extends substantially perpendicular to said neck portion.

5. An apparatus according to claim 1, wherein said at least one fastener and said body are made from a high-temperature plastic in an unitary injection molding process.

6. The apparatus of claim 1, wherein said tail portion includes a catch.

7. The apparatus of claim 6, wherein said at least one fastener is sized to substantially reside within a corresponding through-hole formed in the circuit board.

8. A combination comprising:

a circuit board having a top surface and an opposite bottom surface, said circuit board including at least one third surface defining at least one through-hole extending between said top and bottom surfaces;
    an electrical component having a body and at least one fastener integrally formed with said body, said at least one fastener including:
        a tail portion distal from said body of said electrical component; and
        a neck portion extending from said body to said tail portion;
    wherein said at least one fastener is configured to substantially reside within said at least one through-hole; and
    solder; and
    wherein said at least one fastener is formed so that when said electrical component is engaged to said circuit board adjacent said top surface and a force is applied to said electrical component in the direction normal to said top surface and away from said circuit board, said force is substantially opposed by shearing forces between said at least one third surface and said solder, said shearing forces being transferred to said at least one fastener via said solder.

9. The combination of claim 8, further comprising a solder paste lining said at least one through-hole, wherein said at least one fastener engages said component to said circuit board after reflow of said solder paste.

10. The combination of claim 8, wherein said component is a connector.

11. The combination of claim 8, wherein said component is a guide rail for a card interface device.

12. The combination of claim 8, wherein said tail portion defines an outer surface and said through-hole defines a wall, said outer surface extending proximate said wall.

13. The combination of claim 8, wherein said tail portion includes a catch, said catch engaging said solder after reflow of said solder paste.

14. The combination of claim 13, wherein said catch defines a ledge extending substantially perpendicular to said neck portion.

15. The combination of claim 14, wherein said tail portion and said neck portion define an L-shape.

16. A method for engaging an electrical component to a circuit board, comprising the steps of:

(a) providing the electrical component having at least one fastener formed therewith, the fastener comprising a tail portion and a neck portion engaged to the electrical component extending between the electrical component and the tail portion;

(b) providing the circuit board with at least one through-hole defining at least one first surface and having a preformed solder lining, the at least one through-hole configured for receiving the at least one fastener and the at least one fastener configured to substantially reside within the at least one through-hole;

(c) inserting the at least one fastener into the at least one through-hole; and (d) reflowing the preformed solder to engage the fastener to the through-hole of the circuit board;

wherein said at least one fastener is formed so that when said electrical component is engaged to said circuit board adjacent said top surface and a force is applied to said electrical component in the direction normal to said top surface and away from said circuit board, said force is substantially opposed by shearing forces between said at least one first surface and said solder, said shearing forces being transferred to said at least one fastener via said solder.

17. The method of claim 16, wherein step (d) is preceded by step (c.1) of placing the component and circuit board in an oven.

18. The method of claim 16, wherein the tail portion of the at least one fastener provided in step (a) includes a catch for engaging the reflowed solder.

19. The method of claim 16, wherein the electrical component and the at least one fastener provided in step (a) are made from a high-temperature plastic.

20. The method of claim 19, wherein the component and fastener provided in step (a) are integrally formed by a unitary injection molding process.

21. An apparatus for engaging an electrical component to a circuit board defining a top surface, an opposite surface, and at least one third surface defining at least one through-hole, comprising:

at least one fastener having a tail portion and a neck portion; and solder; and wherein said electrical component is engaged to said circuit board adjacent said top surface, and wherein force applied to said electrical component in the direction normal to said top surface and away from said circuit board is substantially opposed by shearing forces between said at least one third surface and said solder, said shearing forces being transferred to said at least one fastener from said solder.

22. The apparatus of claim 21, wherein said at least one fastener is positioned completely within said at least one through-hole.

23. An electrical component, suitable for being engaged with a circuit board defining a top surface, an opposite surface, and at least one through-hole defining at least one third surface, the electrical component comprising an integrally formed fastener formed so as to be positioned substantially within said through-hole and secured thereto with solder and to transfer force applied to the electrical component in the direction normal to said top surface and away from said circuit board to said circuit board substantially via shearing forces between said at least one third surface and said solder, said shearing forces being induced to said solder via said at least one fastener.

* * * * *